(12) United States Patent
Gaud et al.

(10) Patent No.: US 10,283,660 B2
(45) Date of Patent: May 7, 2019

(54) PHOTOVOLTAIC DEVICES COMPRISING AN ANTI-REFLECTIVE LAYER CONTAINING DISPERSED OBJECTS HAVING AREAS WITH DIFFERENT REFRACTIVE INDICES

(75) Inventors: Vincent Gaud, Talence (FR); Mélanie Louarn, Bordeaux (FR); Fabien Rouge, Bordeaux (FR)

(73) Assignee: Polyrise, Pessac (FR)

( * ) Notice: Subject to any disclaimer, the term of this patent is extended or adjusted under 35 U.S.C. 154(b) by 8 days.

(21) Appl. No.: 13/636,559

(22) PCT Filed: Mar. 23, 2011

(86) PCT No.: PCT/FR2011/050615
§ 371 (c)(1),
(2), (4) Date: Nov. 26, 2012

(87) PCT Pub. No.: WO2011/117538
PCT Pub. Date: Sep. 29, 2011

(65) Prior Publication Data
US 2013/0061905 A1 Mar. 14, 2013

(30) Foreign Application Priority Data
Mar. 23, 2010 (FR) ...................... 10 52069

(51) Int. Cl.
| | | |
|---|---|---|
| H01L 31/048 | (2014.01) | |
| C09D 5/00 | (2006.01) | |
| C23C 18/12 | (2006.01) | |
| G02B 1/11 | (2015.01) | |
| C09D 7/62 | (2018.01) | |

(52) U.S. Cl.
CPC ............ H01L 31/048 (2013.01); C09D 5/006 (2013.01); C09D 7/62 (2018.01); C23C 18/127 (2013.01); C23C 18/1254 (2013.01); G02B 1/11 (2013.01); Y02E 10/50 (2013.01)

(58) Field of Classification Search
CPC .. C09D 5/006; C09D 7/1225; C23C 18/1254; G02B 1/11; Y02E 10/52; H01L 31/048
USPC .................................................. 136/244, 256
See application file for complete search history.

(56) References Cited

U.S. PATENT DOCUMENTS

| | | | |
|---|---|---|---|
| 6,130,379 A | 10/2000 | Shiotsuka et al. | |
| 6,383,559 B1 * | 5/2002 | Nakamura ................ | B32B 7/02 |
| | | | 359/609 |
| 6,497,957 B1 * | 12/2002 | Border .................... | G02B 1/111 |
| | | | 428/143 |
| 7,960,021 B2 * | 6/2011 | Im ........................ | C09D 133/14 |
| | | | 359/601 |
| 2004/0253443 A1 | 12/2004 | Anselmann et al. | |
| 2006/0049476 A1 * | 3/2006 | Koizumi et al. ............... | 257/432 |
| 2006/0131598 A1 * | 6/2006 | Koh ............................... | 257/98 |
| 2007/0190305 A1 | 8/2007 | Yamaki et al. | |
| 2008/0239513 A1 * | 10/2008 | Karszes et al. ............... | 359/741 |
| 2008/0241474 A1 * | 10/2008 | Kawai et al. .................. | 428/149 |
| 2009/0022948 A1 | 1/2009 | Takemoto et al. | |
| 2009/0071532 A1 | 3/2009 | Chan et al. | |
| 2009/0230394 A1 * | 9/2009 | Nagaraja et al. ............... | 257/59 |
| 2010/0330008 A1 * | 12/2010 | Izu ........................ | A61K 8/0275 |
| | | | 424/59 |

FOREIGN PATENT DOCUMENTS

| | | | | |
|---|---|---|---|---|
| EP | 2128090 A1 | 12/2009 | | |
| EP | 2161759 A1 | 3/2010 | | |
| WO | 2008140282 A2 | 11/2008 | | |
| WO | 2009023353 A1 | 2/2009 | | |
| WO | WO 2009030703 A2 * | 3/2009 | .............. | C08J 3/128 |

OTHER PUBLICATIONS

"Poly(tetrafluoroethylene) Properties", Chemical Book, [online], [retrieved on Sep. 21, 2017]. Retrieved from the Internet<URL: http://www.chemicalbook.com/ChemicalProductProperty_EN_CB4392561.htm>, pp. 1-3.*
"Zinc Oxide Properties", Chemical Book, [online], [retrieved on Sep. 21, 2017]. Retrieved from the Internet<URL: http://www.chemicalbook.com/ChemicalProductProperty_EN_CB3853034.htm>, pp. 1-7.*
English Translation of International Search Report and Written Opinion for PCT/FR2011/050615 dated May 21, 2012.

* cited by examiner

*Primary Examiner* — Tae-Sik Kang
(74) *Attorney, Agent, or Firm* — Steven M. Ritchey; Thompson Coburn LLP

(57) ABSTRACT

The present invention relates to photovoltaic devices which comprise:
  a semiconducting material able to ensure a photovoltaic effect when it is subject to electromagnetic radiation;
  a anti-reflective layer, transparent towards said electromagnetic radiation ensuring the photovoltaic effect, this anti-reflective layer containing, in the dispersed state, objects with dimensions of less than 5 microns, preferably less than 2 microns, said objects comprising at least two areas consisting of two different substrates, transparent towards said electromagnetic radiation and having distinct refraction indices, i.e.:
    a core having a first refractive index $n_C$; and
    a layer surrounding the core, a so-called crust, having a second refractive index $n_E$, distinct from the refractive index $n_C$ of the core, the ratio of the dimensions of the core to the dimensions of the core/crust assembly being comprised 1:1.5 and 1:5.

25 Claims, No Drawings

PHOTOVOLTAIC DEVICES COMPRISING AN ANTI-REFLECTIVE LAYER CONTAINING DISPERSED OBJECTS HAVING AREAS WITH DIFFERENT REFRACTIVE INDICES

CROSS-REFERENCE TO RELATED APPLICATIONS

This application is a National Stage application of International Patent Application No. PCT/FR2011/050615, filed on Mar. 23, 2011 which is incorporated by reference herein in its entirety, which claims the benefit of French Application No. 10 52069 filed Mar. 23, 2010 which is incorporated by reference herein in its entirety.

The present invention relates to photovoltaic devices of the photovoltaic cell and module type, which have high efficiency because of the presence of one or several layers having anti-reflective properties allowing improvement in light transmission.

By "layer with anti-reflective properties", is meant here a layer which, deposited on a solid substrate, allows reduction in the reflection properties for at least certain electromagnetic waves in the range from ultraviolet to infrared (typically having a wavelength comprised between 250 nm and 1500 nm) on the modified surface of the solid substrate, by increasing the transmission of these waves.

Obtaining anti-reflective properties is most particularly sought in the field of photovoltaic conversion where a decrease in reflection is expressed by an increase in the converted amount of incident light and therefore by an increase in the conversion yield.

In order to avoid reflection phenomena within the scope of photovoltaic conversion, different solutions have been proposed which do not prove to be fully satisfactory.

In particular, photovoltaic cells of a first generation have been described, which comprise a semiconductor material, generally a slice (wafer) of silica, either monocrystalline or polycrystalline, either doped or not, covered with a layer which i.a. gives the possibility of providing an anti-reflective effect and therefore increasing the amount of incident light received by the semiconductor.

This layer typically consists of silicon nitride, which may notably be deposited as a vapor phase by plasma deposition for example according to the so-called PECVD ("Plasma enhanced chemical vapor deposition") technique. Silicon nitride, originally proposed for passivating the surface of the silicon by replacing titanium oxide or zinc sulphide layers which were historically used for this purpose, is found to further have anti-reflective properties. Alternatively, more recently, anti-reflective coatings based on SiC derivatives, have been proposed. For more details on this subject, reference may notably be made to Progress in Photovoltaics: Research and Applications. Prog. Photovolt: Res. App. 7, 245-260 (1999).

The anti-reflective effect provided by a deposit based on silicon nitride of the aforementioned type is however relatively limited. In particular, this is an anti-reflective effect centered on a given wavelength exclusively. Indeed, the obtained anti-reflective effect is especially sensitive for a given wavelength $\lambda_0$ defined by the formula $\lambda_0=4n.e$, wherein n is the refractive index of the anti-reflective layer and e is its thickness (n being preferably equal to $(n_1 \cdot n_2)^{1/2}$ wherein $n_1$ and $n_2$ designate the refraction indices of the media on either side of the anti-reflective layer).

In order to obtain an anti-reflective effect over a wider range of wavelengths, the use of bilayer or multilayer anti-reflective treatments for example of the type of a $MgF_2/ZnS$ bilayer deposited on silicon has been proposed, as described in Res. Energ. Ren.: Valorisation) 43-46 (1999). These multilayer deposits however prove to be costly and this all the more so since the number of deposited layers is high, and the materials used for making the multilayers are generally not very efficient in terms of passivation of the semiconductor (by "passivation" is meant here the property of inhibiting recombination of electron/hole pairs created by the photovoltaic effect).

The anti-reflective deposits of the aforementioned type made on semiconductors are generally used not on isolated photovoltaic cells but on photovoltaic modules. The term of "photovoltaic module" (or more simply "module"), in the sense as it is used in the present description, designates a photovoltaic device comprising several photovoltaic cells electrically connected with each other and covered by a polymer (for example embedded within a polymer matrix), the cover polymer typically being an ethylene-vinyl acetate (EVA) matrix. In modules of this type, the reflection properties of photovoltaic cells are modified with respect to their properties in the isolated state, notably taking into account their being put into contact with the polymer matrix, which has a very different refractive index from that of the air with which the cell is put into contact when it is in the isolated state.

An object of the present invention is to provide means allowing improvement in the conversion of photovoltaic devices by getting rid as much as possible of the drawbacks encountered with the presently recommended solutions in order to ensure an anti-reflective effect, and which are at least as efficient, and preferably more performing than the solutions proposed today and allowing in particular access to photovoltaic devices having good photovoltaic conversion efficiency over an extensive range of wavelengths.

For this purpose, the present invention proposes applying in photovoltaic devices, a very specific anti-reflective layer, based on dispersed objects having areas with distinct refractive indices, which may be easily deposited and in a single step, unlike the presently recommended multilayer deposits.

The object of the invention is therefore a photovoltaic device which comprises:
  a semiconducting material (which may optionally be a combination of semiconducting materials) able to ensure a photovoltaic effect when it is subject to electromagnetic radiation;
  an anti-reflective layer transparent towards said electromagnetic radiation ensuring the photovoltaic effect, this anti-reflective layer containing in a dispersed state, objects with dimensions of less than 5 microns, preferably less than 2 microns, said objects comprising at least two areas consisting of two different substrates, transparent towards said electromagnetic radiation and having distinct refractive indices, i.e.:
    a core having a first refractive index $n_C$; and
    a layer surrounding the core, said to be a crust, having a second refractive index $n_E$, distinct from the refractive index $n_C$ of the core, the ratio of the dimensions of the core to the dimensions of the core/crust assembly being comprised between 1:1.5 and 1:5.

It is understood that this anti-reflective layer, particular to the invention, is placed on the path of the electromagnetic radiation, i.e. between the outside medium and the semiconducting material.

The object of the invention is also generally the use of a material transparent towards electromagnetic radiation, containing in a dispersed state, objects with dimensions of less than 5 microns, preferably less than 2 microns, said objects comprising at least two areas consisting of two different substrates, transparent towards said electromagnetic radiation and having distinct refractive indices, i.e.:

a core having a first refractive index $n_C$; and a layer surrounding the core, a so-called crust, having a second refractive index $n_E$, distinct from the refractive index $n_C$ of the core, the ratio of the dimensions of the core to the dimensions of the core/crust in order to form an anti-reflective layer for a photovoltaic device, this layer is transparent towards the electromagnetic radiation ensuring the photovoltaic effect.

In an embodiment, the object of the present invention is photovoltaic devices which comprise:

a semiconducting material (which may optionally be a combination of semiconducting materials) able to ensure a photovoltaic effect;

a protective layer of said semiconducting material (typically a glass sheet or a polymeric sheet, for example based on polyethylene terephthalate (PET), or ethylene tetrafluoroethylene (ETFE), this protective layer may notably be deposited on a polymeric sublayer such as an EVA matrix); and between the semiconducting material and the protective layer (generally between the semiconducting material and the polymeric sublayer of the EVA type, when such a sublayer is present), an anti-reflective internal layer transparent towards said electromagnetic radiation ensuring the photovoltaic effect, this anti-reflective internal layer containing in the dispersed state, objects with dimensions of less than 5 microns, preferably less than 2 microns, still more preferentially less than 1 micron, or even less than 500 nm, said objects comprising at least two areas consisting of two different substrates, transparent towards said electromagnetic radiation and having distinct refractive indices, i.e.:

a core having a first refractive index $n_C$; and a layer surrounding the core (designated hereafter by «crust»), having a second refractive index $n_E$ distinct from the refractive index $n_C$ of the core, where the ratio and dimensions of the core to the dimensions of the core/crust assembly is comprised between 1:1.5 and 1:5.

These photovoltaic devices according to the invention have a specific laminated structure which typically includes a multilayer structure deposited on the semiconducting material (which may moreover appear as one or several semiconducting layers), this multilayer structure deposited on the semiconducting material typically including, in this order, from the semiconducting material outwards:

optionally one or several layers intended to provide an anti-reflective effect, for example a SiN layer of the aforementioned type, at least one anti-reflective internal layer according to the invention (optionally a succession of several layers of this type, for example, 2 or 3 layers), containing in the dispersed state, objects with dimensions of less than 5 microns with a core/crust structure based on substrates having distinct refractive indices;

optionally (and most often) a polymeric layer (for example a matrix of the EVA type used for binding together several photoelectric cells including an anti-reflective layer according to the invention, in the form of a photovoltaic module;

at least one protective layer (typically a glass plate or a plastic material sheet).

More generally, the anti-reflective layer which is present in the devices according to the invention may either be in direct contact with the semiconducting material or be deposited over one or several other layers deposited intermediately on the semiconducting material.

Thus, according to a particular embodiment, the semiconducting material is either doped or non-doped silicon, on which is deposited a silicon nitride layer, and then the anti-reflective internal layer according to the invention, this semiconductor/SiN/anti-reflective internal layer assembly itself being covered by the protective layer, typically a glass plate (with generally a polymeric layer of the EVA type between the anti-reflective internal layer and the protective layer).

The anti-reflective layer used within the scope of the present invention has the advantage of being able to be used in present photovoltaic devices without having to modify their synthesis method (the deposit of the anti-reflective internal layer being simply inserted between the usual layer deposits in the synthesis of photovoltaic systems), and with an acceptable overcost, in the sense that the costs related to the integration of the additional anti-reflective layer are widely compensated by the improvement in the efficiency of the device, which is globally expressed by a reduction in the production costs of electric power. The anti-reflective layers according to the invention may notably be used in first generation photovoltaic devices, as illustrated in the example given at the end of the present description. Alternatively, they may be used in devices of subsequent generations (devices of second and third generations notably).

The anti-reflective internal layer used according to the invention may, according to a possible embodiment, be applied as additions to other anti-reflective layers present in the device (SiN layer for example) or else, according to an alternative embodiment, as a single anti-reflective layer, excluding anti-reflective layers not comprising objects with dimensions of less than 5 microns with a core/crust structure based on substrates having distinct refractive indices.

The anti-reflective internal layer deposited according to the invention is typically deposited on a semiconductor on which electric tracks (contacts) have been deposited beforehand by screen printing. Preferably, before depositing the anti-reflective layer of the invention, these electric tracks are reversibly protected. This reversible protection may typically be achieved by depositing a peelable adhesive on the electric tracks, at least at the electric contacts of the device, this peelable adhesive may then be easily withdrawn after depositing the anti-reflective layer, in order to make the electric contacts again accessible.

According to a specific embodiment, the protective layer present in the devices according to the invention may further be itself provided with anti-reflective coating (in particular when this is a glass or polymeric sheet), which further improves the photovoltaic conversion of the device, by increasing the amount of incident light provided to the semiconducting material. According to the specific embodiment, the anti-reflective coating deposited on the protective layer may advantageously be of the same nature as the anti-reflective internal layer, i.e. it advantageously is a transparent (single- or multi-layer) coating, containing in the dispersed state, objects with dimensions of less than 5 microns, preferably less than 2 microns, still more preferentially less than 1 micron, or even less than 500 nm, said object comprising at least two areas consisting of two different substrates, transparent towards said electromagnetic radiation and having distinct refractive indices, i.e.:

a core having a first refractive index $n'_C$; and a layer surrounding the core (designated hereafter by «crust»), having a second refractive index $n_E$ distinct from the refractive index $n'_C$ of the core, where the ratio of the dimensions of the core to the dimensions of the core/crust assembly is comprised between 1:1.5 and 1:5.

The invention also finds application to photovoltaic devices comprising or consisting of a solar concentration system equipped with a lens. An anti-reflective layer according to the invention may be applied thereon according to the embodiment which has just been described, i.e. as an anti-reflective internal layer. It is also possible in a particular embodiment to apply an anti-reflective layer of this nature on one face or on both faces of the lens, in direct or indirect contact with the corresponding surface of the lens. It is also possible to combine an anti-reflective internal layer and one or two anti-reflective layers applied on one or both faces of the lens. In order to facilitate the following discussion, the name of «anti-reflective internal layer» will equally be used except if obviously mentioned otherwise, for all the embodiments of the invention.

The anti-reflective internal layer deposited on the semiconducting material according to the present invention, and the objects which it contains, are transparent at least towards electromagnetic waves allowing the photovoltaic effect in the device. They are typically visually transparent (i.e. transparent for all or part of visible light). Alternatively, they may only be optically transparent, i.e. only transparent for certain invisible radiations.

In the sense of the present invention, a coating, an object, a material or a substrate is said to be "transparent", for an electromagnetic radiation of a given wavelength $\lambda$, when it lets through a flux of said electromagnetic radiation, preferably without absorbing this flux or only absorbing a minority portion of this flux. A material or a substrate said to be transparent at a wavelength $\lambda$ preferably has a molar absorption coefficient as low as possible at this wavelength, this molar absorption coefficient (also called a molar "extinction" coefficient) being preferably less than or equal to 200 $L \cdot mol^{-1} \cdot cm^{-1}$, and more preferentially less than or equal to 100 $L \cdot mol^{-1} \cdot cm^{-1}$, at the relevant wavelength.

The core and the crust of the objects which are present in the dispersed state in the anti-reflective internal layer of the devices according to the present invention (and optionally in the coating deposited on the protective layer) consist of substrates which are transparent notably towards the electromagnetic radiation for which the anti-reflective effect is sought. The refractive indices of the substrates making up the core and of the crust of these dispersed objects to which reference is made in the present description, i.e. respectively the first refractive index $n_C$ of the core and the second refractive index $n_E$ of the layer surrounding the core, designate the refractive indices of the substrates at the wavelength (or at the wavelengths) of the electromagnetic radiation for which the anti-reflective treatment is sought.

The anti-reflective internal layer of the devices according to the present invention is generally a single layer, resulting from the deposition of a single and unique layer. Typically, this anti-reflective internal layer has a thickness comprised between 10 nm and 1 micron, more preferentially between 50 nm and 500 nm. Generally, the internal layer is applied under conditions ensuring its anti-reflective function it being understood that this function may be ensured by this sole layer or by a combination of layers, including it.

It is often preferable (notably for limiting any absorption parasitic phenomenon, that the anti-reflective internal layer of the devices according to the invention have a thickness of less than 1 micrometer, less than 800 nm, and still more preferentially less than 500 nm, this thickness being advantageously comprised between 10 and 600 nm, notably between 50 and 500 nm; for example between 100 and 400 nm. It should be noted on this subject that it is preferable that the size of the objects present in the coating deposited according to the invention be all the larger since the wavelength of the radiation for which the anti-reflective effect is sought, is large (typically for an electromagnetic radiation of a given wavelength $\lambda$, it is preferable that the core of the objects have dimensions greater than $\lambda/4$ and that the deposited thickness on the core be also greater than $\lambda/4$).

The objects which are dispersed within the anti-reflective internal layer of the device according to the present invention are isotropic or anisotropic objects preferably having dimensions of less than 2 microns, these dimensions being typically comprised between 2 nm and 1 micron. Notably in such a way that they have core and crust areas with clearly distinct refractive indices, these dispersed objects preferably have dimensions equal to at least 3 nm, and more preferentially of at least 5 nm (these dimensions being advantageously greater than or equal to 10 nm; or even 20 nm, for example at least 50 nm). Typically, the objects which are dispersed within the anti-reflective internal layer of the devices of the present invention have dimensions comprised between 10 nm and 800 nm, for example between 20 and 600 nm. These dimensions should be selected as being all the smaller since the sought thickness for the transparent coating is small (the thickness of the transparent coating is generally at least equal to the dimension of the dispersed objects which it contains). Thus, it may typically prove to be interesting if the anti-reflective internal layer comprise dispersed objects having dimensions of less than 400 nm, for example less than 300 nm, more preferentially less than or equal to 200 nm, or even less than or equal to 100 nm, for example less than or equal to 50 nm.

The objects which are dispersed within an anti-reflective internal layer of the devices of the present invention are generally formed by a core of the aforementioned type having a first refractive index $n_C$ surrounded by the crust having the second refractive index $n_E$.

Alternatively, however the dispersed objects may comprise at least one additional coating layer around this core-crust assembly. If necessary, each of the additional coating layers is formed by a material transparent towards the electromagnetic radiation for which the anti-reflective effect is sought and, preferably, each of the additional coating layers has a different refractive index from that of the layer(s) with which it is in contact.

In the objects present in this dispersed state within the anti-reflective internal layer of the devices of the present invention, the crust which surrounds the core is formed by a substrate of organic and/or inorganic nature, as well as the optional coating layer(s). Most often, the core of the objects present in the dispersed state within the internal layer is also itself formed by an inorganic and/or organic substrate. According to another more particular embodiment, the core may be empty (according to the specific embodiment, the dispersed objects are of the hollow particle type and the refractive index $n_C$ of the core is then substantially equal to 1).

In the objects which are dispersed within the anti-reflective internal layer of the devices of the present invention, the average thickness of the crust surrounding the core has dimensions of the same order of magnitude as those of the core and with a ratio of the dimensions of the core to the dimensions of the core/crust assembly formed by the core having the first refractive index $n_C$ surrounded by the crust having the second refractive index $n_E$ comprised between 1:1.5 and 1:5, this ratio being advantageously of the order of 1:2.5. In the sense of the present description, the expression «ratio of the dimension of the core to the dimensions of the core/crust assembly», designates the ratio of the characteristic dimension of the core to the characteristic dimension of the core/crust assembly in the case of particles of the isotropic type, or else the ratio of the characteristic dimensions of the core and of the characteristic dimensions of the core/crust assembly within the scope of anisotropic particles. Thus, within the scope of isotropic particles, this ratio may be defined as the ratio of the average diameter of the core over the average diameter of the core/crust assembly.

Typically, a dispersed object present in the anti-reflective internal layer of the devices of the present invention may for example appear as a core with isotropic morphology (substantially spherical for example) and forming with the layer having the second refractive index $n_E$ which surrounds it, a core/crust assembly of isotropic morphology (substantially spherical for example) having an average dimension $d_{C+E}$ comprised between 2 nm and 1 micron, for example between 5 nm and 800 nm, notably between 10 nm and 500 nm, with a $d_C/d_{C+E}$ ratio advantageously comprised between 1:1.5 and 1:5, for example 1:1.8 and 1:4, and typically of the order of 1:2.5.

The dimensions of objects in the dispersed state to which reference is made in the present description, refer to dimensions such as measured by light scattering, notably by dynamic scattering of light, for example by means of a piece of equipment of the Malvern type (Zetasizer). Typically, the dimensions measured by light scattering are determined on objects in the dispersed state. To do this, if need be, the objects for which determination of the dimensions are sought, may be dispersed in a suitable solvent (water, ethanol, water/ethanol mixture, tetrahydrofurane or dimethlsufloxide, for example) at a concentration typically ranging from 0.1 mg/ml to 20 mg/ml. The sample to be analyzed, which contains the objects in the dispersed state, is placed in the incident beam of a laser and the scattering is measured at an angle of 90°. The dimensions measured according to this light scattering method has high resolution, typically the measurement is conducted with an accuracy to within +/−0.4 nm).

These measurements carried out with light diffraction are corroborated by measurement methods using electron microscopy, which further allows access to the dimensions of the constitutive portions (core and crust notably) of the objects for which the more global dimension is determined by light scattering. Particularly suitable analysis methods for accessing the dimensions of the objects in the dispersed state and of their constitutive portions are electron microscope techniques of the SEM (scanning electron microscopy) and TEM (transmission electron microscopy) type, the principles of which are as described in *ASTM standards, Digital library*, chapter 72, J G Sheehan (1995).

Within the scope of the present invention, the inventors have shown that unexpectedly, an internal layer comprising micron or submicron objects of the aforementioned type, i.e. having a core and a coating layer having refractive indices $n_C$ and $n_E$, an efficient anti-reflective effect is imparted and obtained by depositing this single layer within photovoltaic devices where this layer is introduced.

This anti-reflective effect may be observed both for isolated photovoltaic cells and for photovoltaic modules in the form of a photovoltaic module comprising several photovoltaic cells electrically connected with each other and embedded within a polymeric matrix or covered by a polymer. It is within the competences of one skilled in the art to adapt the exact nature of the anti-reflective coating to be used according to the case.

Without intending to be bound by a particular theory, in the light of the work carried out by the inventors within the scope of the invention, it seems possible to put forward that this anti-reflective effect is at least partly explained by the fact that each of the dispersed objects would behave like a kind of "nano-domain" having, at its local level, a structure of the multilayer type which would make it able to locally ensure a similar effect to the one observed with customary multilayer (more macroscopic) deposits, the addition of these local effects imparting to the material particularly interesting global anti-reflective properties.

It emerges from the experiments conducted by the inventors that the dispersion of the objects having this "local multilayer structure" within the deposited coating ensure a similar anti-reflective effect, if not improved as compared with the effect observed with multilayer deposits. Generally, it is preferable that the anti-reflective layers deposited according to the invention be not subject to heat treatments which may affect this specific structure and in particular the aforementioned local multilayer structure. For this purpose, it is preferable that the anti-reflective internal layer(s) deposited according to the invention be not subject to temperatures exceeding 250° C., and preferably their temperature is preferably maintained at values not exceeding 200° C., preferably not exceeding 180° C.

In certain rare cases, a heat treatment of an anti-reflective layer according to the invention may be contemplated without affecting the maintaining of a structure of the "local multilayer structure" type of the aforementioned kind. In this case, it may notably be contemplated to carry out the deposition of electric tracks (contacts) on the surface of the anti-reflective layer rather than prior to the deposition of this layer.

In the other cases, the heat treatment of an anti-reflective layer according to the invention, which generally should be prohibited, leads, if it is applied, to obtaining nanostructured or nanoporous layers which, although of a different structure from that of the initial anti-reflective layer, may have interesting properties, notably anti-reflective properties. Within this scope, the anti-reflective layers according to the invention may be used as precursor layers of nanostructured or nanoporous layers. This conversion may for example be observed when a metal track is deposited by screen printing on an anti-reflective layer according to the invention, which generally involves a heat treatment at a temperature of at least 600° C.

Further, it is found that the anti-reflective layers prepared according to the invention further have transparence properties at least similar to those of the multilayer deposits known from the state of the art. In many cases, this transparence is even superior (indeed, insofar that they only require a single deposit as a monolayer) the anti-reflective deposits according to the invention may prove to be more transparent than thicker multilayer coatings where the radiation absorption phenomena are more likely to occur). These transparence properties, obtained without having to apply a complicated technique, makes anti-reflective deposits of the invention, an alternative solution of choice to multilayer coatings, which give the possibility of simply having access to transparent materials having a high transmission of electromagnetic waves ranging from UV to infrared.

Moreover, insofar that it only requires the deposition of a single layer for obtaining the sought enhancement effect, the means for providing the anti-reflective effect, applied within the scope of the present invention, prove to be less costly and take less time to be applied than the methods with multilayer deposits, which again is another of the advantages of the present invention.

Although a single layer is sufficient as an anti-reflective internal layer in the devices of the present invention in order to obtain the sought anti-reflective effect, it is possible, according to a particular embodiment to deposit several successive anti-reflective internal layers (for example at least 2, or even at least 3) between the semiconducting material and the protective layer, where these anti-reflective internal layers contain, in a dispersed state, objects having the aforementioned core-crust structure. Multilayer deposits of this type may notably be used for imparting particularly pronounced anti-reflective properties.

The anti-reflective effect imparted by the anti-reflective layer generally proves to be all the more pronounced since the refractive indices $n_C$ and $n_E$ of the core and of the coating layer (crust) which surrounds it, are different. Within this scope, it generally proves to be advantageous if, at the wavelength (and most often at wavelengths) of the electromagnetic radiation for which the anti-reflective effect is sought, the difference $(n_C-n_E)$ between the refractive indices of the core and of the coating layer which surrounds it, is in absolute value greater than 0.01, this difference being more advantageously of at least 0.1, and still more advantageously of at least 0.2. Differences of 0.3 or more most often lead to even more interesting results.

The transparent internal layer which plays the role of a carrier of the dispersed objects in the devices according to the present invention may be any type of layer which may be deposited with a thickness of less than 10 microns, more preferentially less than 5 microns and still more advantageously less than 1 micron, or even less than 500 nm, for example between 10 and 400 nm, notably between 20 and 200 nm. This may for example be a varnish or a polymeric layer.

According to a particularly interesting embodiment, the anti-reflective internal layer present in the devices of the present invention is a sol/gel coating. Sol/gel coatings are coatings of a well-known type, which are obtained by hydrolyzing mineral alkoxides such as silicon, titanium, zirconium or zinc alkoxides which leads to a reaction similar to the polymerization of mineral species, leading in a first phase to the formation of a sol of mineral oxide particles (silica, $TiO_2$ or $ZrO_2$ for example), and then to gradual gelling of the medium, in fine, leading to cross-linking of the whole of the mineral species being obtained in the form of a rigid structure analog to a glass. The so-called «sol/gel» deposits are deposits carried out by depositing on a substrate a layer of a reaction medium of this type, in the state of a non-gelled or partly gelled sol state, and then by letting the gelling continue until hardening of the layer is obtained. The deposition may be carried out by any suitable conventional method, notably by the so-called dipping technique ("dip-coating") or by centrifugal deposition ("spin-coating") which are well known techniques, notably from *Process Engineering Analysis in Semiconductor Device Fabrication*, S. Middlemann & A. Hochberg, Mcgraw-Hill College, p. 313 (1993), or else from application EP 1 712 296. Other suitable deposition techniques in particular include spraying methods (said to be by "spraying"), notably depositions by spraying by means of nozzles subject to ultrasonic vibrations (said to be by "ultrasonic spraying"), of the type of equipment marketed by Sono-Tek.

The making of the anti-reflective internal layer according to the invention by means of the aforementioned sol/gel technique advantageously includes a heat treatment step (drying) at the end of the gelling, which allows optimization of the hardening of the deposited sol/gel layer, and, as a result, good cohesion may be imparted to the obtained coating in fine. This heat treatment may be both conducted with hot air or with infrared radiation. This treatment is preferably carried out by placing the semiconductor provided with the anti-reflective coating being formed in an oven at a temperature comprised between 20 and 200° C., more preferentially between 50 and 150° C. According to an interesting embodiment, the heat treatment is carried out by gradually raising the temperature from the deposition temperature of the sol/gel coating on the substrate (typically between 10 and 25° C.) to the heat treatment temperature (typically at least 50° C.), with a temperature rise rate typically comprised between +0.5° C./minute and +5° C./minute.

When the anti-reflective internal layer of the devices of the invention is a transparent coating deposited by the aforementioned sol/gel technique, the mineral alkoxide which is used is advantageously a tetraalkoxysilane, preferably a tetramethoxysilane (a compound fitting the formula $Si(OCH_3)_4$, generally designated by its acronym TMOS, and sometimes designated by tetramethylorthosilicate) or else further tetraethoxysilane (or TEOS), of formula $Si(OC_2H_5)_4$. More preferably, the mineral alkoxide used is tetramethoxysilane TMOS. Alternatively, the mineral alkoxide which is used may be a titanium alkoxide (titanate isopropoxide for example) or else a zinc alkoxide (such as zinc isopropoxide).

According to a particular embodiment, which generally proves to be of interest, the transparent coating which plays the role of a carrier for the objects dispersed in the anti-reflective internal layer of the devices according to the present invention may be a coating of a particular sol/gel type, obtained from a mixture initially comprising (i) at least one mineral alkoxide, preferentially of the aforementioned type; and (ii) at least one UV-crosslinkable monomer or crosslinkable under the effect of a heat treatment (typically in the presence of a free radical source). In this case, an anti-reflective internal layer is generally obtained, having a particularly high cohesion, insofar that the synthesis of the coating then includes a dual hardening level, i.e.:

a first hardening is obtained by hydrolysis and condensation of the mineral alkoxide according to the sol/gel technique; and jointly and/or additionally, an additional hardening is effected by crosslinking of the crosslinkable monomer(s), typically under the effect of UV irradiation and/or heating depending on the exact nature of the monomers to be crosslinked.

The crosslinkable monomers which may be used according to this specific alternative of the method of the invention may be non-polymerized monomer species bearing functions able to make them crosslinkable under UV radiation or thermally. Alternatively, these may be macromolecular species such as oligomers or polymers bearing functions able to make them crosslinkable under UV radiation or thermally. The monomers, crosslinkable under UV radiation or via a thermal route, used according to this embodiment, are typical compounds bearing methacrylate, acrylate, epoxy, or vinyl ether groups. Alternatively, it is possible to use mixtures of both types of monomers bearing additional functions which react with each other when they are in contact in order to lead to crosslinking by condensation (within the scope of this alternative, it is for example possible to use the pairs of the following reactive functions: epoxy/amine; acrylate/amine; isocyanate/alcohol; thiol/ene; or epoxy/isocyanate.

Generally, when the transparent coating used in the anti-reflective internal layer of the devices according to the present invention is of the sol/gel type, it is preferable that this sol/gel coating be synthesized in the presence of at least one surfactant, in particular of the type described in *Sol-Gel Sciences: Sol-Gel: The Physics and Chemistry of Sol Gel Processing*, C. Jeffrey Brinker and George W. Scherer, Academic Press (1990) or in the *Journal of Colloids and Interface Science*, Vol. 274, Issue 2, 355-361. The use of this type of surfactant allows limitation in the size of the particles in the sol obtained by hydrolysis of the alkoxide and thus allows control of the thickness of the obtained coating layer in fine. As a surfactant which is well adapted within this scope, mention may notably be made of polyoxethylene surfactants (polyoxyethylene esters in particular), such as TWEEN 85, for example.

Another means with which the size of the particles formed in the sol may be controlled, achieved by hydrolysis of the mineral alkoxide used in the sol/gel technique, consists of using a mixture of alkoxides comprising alkoxides having 4 hydrolyzable groups and alkoxides having at most 3 hydrolyzable groups (for example two or even only one). Within this scope, the sol/gel coating may typically be synthesized by using as a mineral alkoxide, a mixture of alkoxides comprising:

at least one silane having 4 hydrolyzable groups (such as tetramethoxysilane TMOS, or tetraethoxysilane TEOS); and at least one silane having less than 4 hydrolyzable groups, this silane preferably fitting the formula $R_nSiX_{4-n}$, wherein:
n is an integer equal to 1, 2 or 3;
each of the groups R, either identical or different, designate a non-hydrolyzable organic, optionally functional group, and
X is a hydrolyzable group (typically a halogenated alkoxy group for example a trimethoxysilane, triethoxysilane, γ-propyltrimethoxysilane, γ-propyltriethoxysilane, γ-aminopropyl-trimethoxysilane, γ-aminopropyl-triethoxysilane, γ-mercaptopropyl-trimethoxysilane, γ-mercaptopropyl-triethoxysilane, γ-(meth-)acryloylpropryl-trimethoxysilane, γ-(meth-)acryloylpropyl-triethoxysilane, γ-glycidoxypropyl-trimethoxysilane, γ-glycidoxypropyl-triethoxysilane, di-methoxysilane, di-ethoxysilane, polydimethylsiloxane α-ω-disilanol, or polydiethylsiloxane group; or a halogen group such as —Cl or Br).

According to this embodiment, it is possible for example to use silanes bearing a single hydrolyzable group, or precursor compounds of such monofunctional silanes, for example compounds producing a monofunctional silane as a result of a hydrolysis reaction, such as for example 1,1,1,3, 3,3-hexamethyldisilazane (HMDS) or further chlorosilanes such as trimethylchlorosilane.

On the other hand, when a sol/gel method is applied for making the anti-reflective internal layer of the devices according to the present invention, the medium for synthesizing this coating comprises water, optionally combined with one or several water-miscible solvents (for example ethanol). The water is then preferably present in an amount equivalent to half of the hydrolyzable silane functions present in the sol/gel formulation.

Regardless of the nature of the transparent coating which plays the role of a carrier for the objects dispersed in the anti-reflective internal layer of the devices according to the present invention, the dispersed objects which this layer contains, advantageously have preferential characteristics of one of the three alternatives defined hereafter.

According to a first alternative of the invention, the core of the objects present within the anti-reflective internal layer of the devices according to the present invention is of an organic nature.

Within the scope of this first alternative of the invention, the core may for example comprise or be formed with:

at least one linear or (advantageously) branched hydrocarbon polymer, the chains of which optionally bear heteroatoms; or at least one component or a mixture of components having a low molar mass, typically less than 250 g/mol, for example solvents or oily components.

Within the scope of the first alternative defined above, the layer (crust) surrounding the organic core is typically a polymer layer, which may typically be formed around the organic core by emulsion, dispersion, mini-emulsion or spontaneous emulsion polymerization techniques. These techniques and their application method are known to one skilled in the art. For more details in connection with them, it is for example possible to refer to *Soft Matter*, Vol. 2, pp. 940-949 (2006) or to *Chem Phys Chem*. Vol. 6, pp 209-215 (2006).

The objects with a core/crust structure obtained according to this first alternative of the invention are typically capsules (most often but not necessarily spheroidal capsules), which comprise a polymer shell, forming the crust, confining an organic core material, preferably of the aforementioned type (a polymer distinct from the polymer of the crust or non-polymer organic compounds, for example). Regardless of their exact structure, these objects are typically with dimensions between 50 nm and 2 microns, these dimensions being preferably less than 1 micron and more advantageously less than 800 nm, or even less than 500 nm.

Objects with a core/crust structure according to the first alternative of the invention may for example be capsules comprising a crust of polyurethanes or polyamides surrounding a hexadecane core.

Other interesting objects with a core/crust structure according to the first alternative of the invention comprise two polymers of the same type as a core polymer and as a crust polymer (for example two methacrylates) with one of the polymers bearing specific groups not borne by the other polymer (fluorine groups —F for example). In this case, the core/crust structure is typically obtained by carrying out polymerization of the corresponding monomers, initially starting with a polymerization medium only containing the monomers leading to the formation of the core polymer (for example not bearing specific groups), and then enriching the polymerization medium in the monomers leading to the formation of the crust polymer (for example bearing specific groups). Objects with a core/crust structure which may be used according to the first embodiment, may for example be of the type of butyl acrylate and trifluoroethymethyl methacrylate copolymers as described in *Macromolecules*, Vol. 30, 123-129 (1997).

Other objects with a core/crust structure which may be used according to the first alternative of the invention are the self-assemblies of sequenced polymers with a two-block structure comprising a first block having affinity for a given solvent bound to a second block having less strong affinity and preferably no affinity for said solvent. When these polymers are introduced within the solvent, they self-assemble in the form of an object of the core/crust type (the blocks having strong affinity for the solvent forming an external layer surrounding an internal core where the blocks having less strong affinity for the solvents are grouped). Examples of sequenced copolymers leading to this type of self-association in a solvent medium have in particular been described in *Langmuir*, Vol. 22, pp. 4534-4540 (2006) (poly(ethylene)oxide block-N,N-diethylaminoethyl methacrylate block) or *Adv. Funct. Mater.*, Vol. 16, pp. 1506-1514 (2006) (sequenced two-block copolymers of the (poly(ethylene oxide block)-(poly(ε-caprolactone) block) type. These sequenced polymers described in these documents assemble when they are placed in a solvent medium in order to form objects comprising a core based on one of the sequenced polymers and a crust based on the other sequenced polymer.

According to a second alternative of the invention, the core of the objects present within the anti-reflective internal layer of the devices according to the present invention is of an inorganic nature.

Within the scope of this second alternative of the invention, the core may for example comprise or be formed with one or several of the following materials:
a mineral oxide, notably silica or a metal oxide
a metal sulfide
a metal nitride
a metal halide
a metal.

More preferentially, the inorganic core of the objects according to the second alternative consists of silica, metal oxides, metal sulfides and/or metals, still more preferentially silica, metal oxides (TiO$_2$ or alumina, notably) or metals (gold, silver, for example).

Within the scope of this second alternative, according to a first embodiment, the layer (crust) surrounding the inorganic core is a polymer layer, this polymer crust may then be prepared according to two great access routes, i.e.:

(1) Methods Said to be of the "Grafting Onto" Type

According to this first approach, one starts with pre-existing inorganic cores (typically inorganic colloidal particles) and the pre-existing polymeric chains (or pre-existing grafts) are immobilized on the surface of these inorganic cores. To do this, the polymer chains or grafts which are desirably immobilized generally bear chemical functions capable of generating a covalent or electrostatic bond with the surface of the inorganic cores or with a group present on the surface of the cores.

For example, it is possible to start from gold colloidal particles and to graft them with polymeric chains bearing a thiol terminus, for example according to the method which was for example described in *J. Am. Chem. Soc.*, Vol. 120, 12696 (1998), wherein α-methoxy-ω-mercapto-poly(ethylene glycol) groups are grafted on gold particles.

2) Methods Said to be of the "Grafting From" Type

According to this second approach, the polymeric chains are grown from functionalized core particles bearing organic groups.

A method which is widely used within this scope, consists of initiating polymerization from inorganic cores (preferably colloidal particles) modified at the surface with groups initiating polymerization. Advantageously, the functional groups introduced on the surface of the inorganic cores are control agents enabling a controlled radical polymerization reaction of the ATRP type. For example, it is possible to use gold particles functionalized with thio groups. Brominated polymerization initiators may be grafted by the ligand exchange method, and polymerization may be initiated in the presence of monomers such as (meth)-acrylic monomers (methyl methacrylate, ethyl methacrylate, ethyl acrylate . . . ) according to the method for example described in *Angew. Chem. Int. Ed.*, 40, 4016 (2001) or else further in *Macromol. Chem. Phys.*, 1941-1946 (2005). The objects obtained according to the method of this second article (gold core covered with poly(N-isopropylacrylamide) are particularly well adapted for giving an anti-reflective effect according to the invention in the infrared range on the surface of a substrate.

The synthesis of a polymeric crust by ATRP may also be used on inorganic cores of mineral oxides, in particular inorganic cores of silica or titanium oxide (in the form of colloidal particles notably), for example according to the methods of the type described in *Materials Letters*, Vol. 62, Issue 8-9, (2008), or in *Composites Science and Technology*, Vol. 66, Issue 9, July 2006.

It is also possible to graft polymeric chains on the surface of preformed inorganic objects advantageously bearing —OH and/or —SH functions (thio-functionalized gold particles for example) from polycondensation reactions (for example between a dithiol and a diester), advantageously by putting preformed inorganic objects bearing —OH and/or —SH functions in contact with:

monomers including reactive groups including:

(i) at least one group including an α-β unsaturated carbonyl group C═C—C═O (for example, an acrylic, methacrylic or acrylamide group) and/or an α-β unsaturated thiocarbonyl group C═C—C═S; and/or (ii) at least one heterocyclic group comprising from 3 to 5 members (preferably 3 or 4 members), selected from cyclic ethers, cyclic thioethers and aziridine rings, this heterocyclic group preferably being at least one epoxy, thio-expoxy or aziridine group and more preferentially at least one epoxy or thio-expoxy group; and/or (iii) at least one group selected from isocyanate —N═C═O or thio-isocyanate —N═C═S groups and trivalent groups of formula >C═CZ—, wherein Z is an electron attractor group (for example a 4-nitrophenyl, cyano or —C═N— group);

and a catalyst (C) bearing at least one conjugate guanidine function, preferably bearing a conjugate bis-guanidine function fitting the following formula (I):

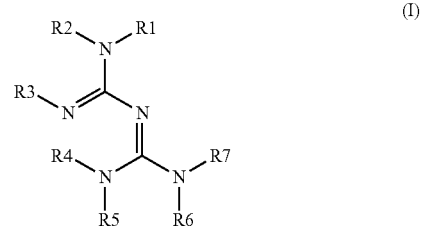

wherein each of the groups R1 to R7 represent independently of the other groups:
a hydrogen atom; or
a cyano group —CN; or
a linear or branched, saturated or unsaturated hydrocarbon chain optionally cyclized either totally or partly, optionally substituted and optionally interrupted with one or several heteroatoms (O, S, N, P, or Si, for example) and/or with groups bearing heteroatoms such as carboxy, amide or carbamate groups (for example with divalent groups —C(=O) O—, —OC(=O)—, —O—C(=O)—O—, >N—C (=O)—, —C(=O)—N<, >N—C(=O)—O—, —O—C(=O)—N<, —C=N—, —N=C—, this chain typically being:
- an either linear or branched alkyl, akenyl, or alkynyl advantageously comprising from 1 to 12 carbon atoms for example from 1 to 6 carbon atoms, this alkyl, alkenyl or alkynyl group being optionally substituted with an alkoxy group for example;
- a cycloalkyl group advantageously comprising from 6 to 18 carbon atoms, optionally substituted with at least one alkyl or alkoxy group for example;
- an aryl group advantageously comprising from 6 to 18 carbon atoms, optionally substituted with at least one alkyl or alkoxy group for example;
- an optionally aromatic heterocycle, comprising one or several atoms selected from S, O or N;
- an alkylaryl or arylalkyl group advantageously comprising from 8 to 18 carbon atoms, wherein the aryl portion is optionally substituted notably with an alkyl or alkoxy group;
- an ester, amide or carbamate group; or
- a polymeric chain, optionally bearing other guanidine groups (preferably conjugate guanidine groups, if necessary).

The catalyst used preferably fits the formula below:

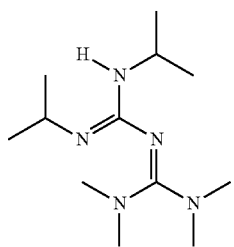 [SMILES: CC(C)/N=C(/N=C(N(C)C)N(C)C)NC(C)C]

The inorganic cores based on a metal oxide, metal sulfide, metal nitride, metal halide or on metal may also be covered (encapsulated) with a polymer crust by any customary methods for emulsion or dispersion synthesis, in particular according to the methods of emulsion or dispersion radical synthesis.

More generally, it is also possible to create a crust in an emulsion notably by polymerization via metathesis by any other suitable encapsulation method, for example according to the method described in *Soft Matter*, Vol. 2, pp. 940-949 (2006).

According to another interesting embodiment of the second alternative applying cores of an inorganic nature, the layer (crust) surrounding the inorganic core consists of an inorganic material distinct from the one present in the core, this material forming the crust then comprising typically an oxide or a sulfide. In this case, it is preferable that the core consists of a metal oxide, a metal sulfide or a metal.

Commercial products having a core and a crust of the metal oxide type are marketed, for example by Ibu-Tech (Germany), who for example propose $ZnO/SiO_2$ compositions, the global size of which is 40 nm, under reference NA403.

As an example of particles which may be used according to the invention, mention may be made of particles with a gold core and a crust of silica as obtained in the article published in *Journal of Nanoparticle Research*, 8, 1083-1087 (2008), by a reverse emulsion technique involving the formation of $NH_4AuCl_4$ micelles covered with a protective layer of silica obtained by reduction of a gold salt within the micelles.

According to a third more specific alternative of the invention, the core of the objects present within the anti-reflective internal layer of the devices according to the present invention is a hollow cavity, typically filled with air, having a refractive index substantially equal to 1, this cavity having dimensions advantageously of less than 1 micron and preferably larger than 20 nm, for example between 50 and 500 nm.

According to this third alternative, the layer (crust) surrounding the core is typically formed with an inorganic material. Most often, the object present within the transparent coating are typically hollow mineral particles, for example hollow silica or mineral oxide particles said to be of the "hollow sphere" type, for example obtained by a micro-emulsion or precipitation of colloidal particles around texturation agents (called "templates"), notably according to the methods described in *Materials Chemistry and Physics*, Vol 111, Issue 1, (2008) or Materials Letters Vol. 62, Issue 24, (2008).

The photovoltaic devices according to the present invention may be isolated photovoltaic cells comprising a semi-conducting core on which the anti-reflective internal layer is deposited (in direct contact with the semiconductor or not), followed by the protective layer, such as a glass plate or a polymeric sheet, for example a PET or ETFE sheet (either in direct contact or not with the anti-reflective internal layer). These photovoltaic cells may be of first generation or else of a subsequent generation.

More advantageously, the devices according to the invention may be photovoltaic modules comprising a combination of several photovoltaic cells comprising a semiconducting core on which is deposited the anti-reflective internal layer (either in direct contact with the semiconductor or not), generally juxtaposed, electrically connected to each other and coated with a polymeric matrix, for example an EVA (ethylene-vinyl acetate copolymer) matrix, this combination of photovoltaic cells being coated with a protective layer, such as a glass plate. The coated photovoltaic cells in the polymeric matrix may for example be placed between two glass plates (two-glass method) or between a glass plate and an assembly consisting of thin layers of polymers (tedlar, mylar) and of aluminum (single-glass method).

Different aspects and advantages of the invention will further become apparent from the example hereafter, wherein a photovoltaic device is made, of the photovoltaic module type based on four photovoltaic cells covered with an anti-reflective layer comprising as dispersed objects, hybrid silica-polyester particles which have a silica core with a diameter equal to 80 nm, covered with a 200 nm polymeric crust, hybrid particles designated hereafter by "hybrid HR1" material.

EXAMPLE 1

Synthesis of the Hybrid HR1 Material

With intensive stirring, an aqueous dispersion with 20% by mass of silica particles with a size equal to 15 nm (Sigma Aldrich) is formed.

While maintaining the stirring, in the dispersion thereby achieved at 40° C., a silane (tetramethoxysilane TMOS) is introduced in an amount of 50% by mass based on the mass of the silica present in the reaction medium, in the presence of a basic catalyst (ammonia), and then 0.6 molar equivalents (based on the introduced amount of TMOS) of a dihydroxylated precursor dissolved in ethanol are introduced (intended to improve «adhesion» of the polymeric layer on the silica cores).

The dihydroxylated precursor used was prepared by making an equimolar mixture of isocyanatopropyltriethoxysilane and of diethanolamine, in the presence of dibutyl tin dilaurate, at a temperature of 50° C. Trimethylolpropane (TMP) and dimethyl succinate (DMS) were then added to this reaction medium, each in an amount of 8 molar equivalents based on the TMOS.

The medium was left to develop for a few minutes, and then the solvents present (water and ethanol) were evaporated in vacuo, at 95° C. Silica particles with a size substantially equal to 80 nm were thereby obtained.

A bisguanidine catalyst was then introduced into the medium, at 40° C. and in a high vacuum (−1 bars), fitting the following formula:

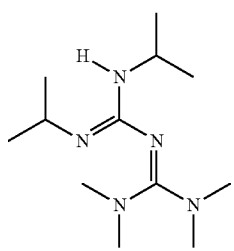 [SMILES: CC(C)/N=C(/N=C(N(C)C)N(C)C)NC(C)C]

The introduction of this catalyst induced polycondensation of the TMP and of the DMS present in the reaction medium, by which a polymeric crust was generated (of the polyester type) around the silica particles.

The thereby obtained structure of the core/crust type was then modified for making it dispersible (in water or in the monomers). For this purpose, functionalization of the surface of the obtained objects was conducted with methacrylate functions, by adding to the obtained particles, methyl methacrylate, in an amount of 1.2 molar equivalents based on TMP (at 40° C. and in a vacuum of −1 bars).

At the end of these different treatments, the hybrid material HR1 was obtained, in the form of a powder comprising hybrid silica-polyester particles, having a silica core with a diameter equal to 80 nm, covered with a 200 nm polymeric crust.

Synthesis of Photovoltaic Cells

Each of the photovoltaic cells was prepared as follows:
Deposition of a SiN Layer and Metallization A single-crystal silicon slice (wafer) with dimensions equal to 125 mm×125 mm and with a thickness equal to 200 microns was cut out in a single crystal, immersed into a potash bath at 80° C. (in order to suppress the surface defects) and then rinsed in a distilled water bath. Doping of the silicon was then achieved by diffusion of phosphorus by placing the wafer in an oven brought to 850° C. in the presence of $POCl_3$ and oxygen. Following this treatment, the slice was immersed in a bath of hydrofluoric acid.

An SiN layer was then deposited on the thereby prepared wafer, according to a direct PECVD method, at a frequency of 40 kHz, at 450° C., in the presence of $NH_3$ and $SiH_4$, whereby an SiN layer with a thickness of 80 nm and having a refractive index of 2.05 was formed.

Metallization of the surface was achieved by forming metal tracks by screen printing on the SiN layer (front contacts) and on the face of the silicon not covered with SiN (rear contacts). These metal tracks were formed by deposition of a silver paste and then by raising it to a temperature of 850° C.

Deposition of an Anti-Reflective Layer According to the Invention Comprising the Hybrid Material HR1

An anti-reflective layer according to the invention was then deposited on the SiN layer according to a sol/gel method by applying the procedure hereafter.

In a flask, at room temperature (25° C.), 0.340 g of distilled water, 6.053 g of ethanol and 30 mg of hydrochloric acid (37%) marketed by Sigma Aldrich under reference 310331 were mixed, and then a mixture of 1.446 g of TMOS (tetramethylorthosilicate with purity equal to 99% marketed by Sigma Aldrich under reference 218472) and of 0.076 g of MPTS (3-(methacryloxy)propyltrimethoxysilane, with a purity equal to 97% marketed by ABCR under reference AB117674) was added.

The flask was shut off and the mixture was left to react at room temperature (25° C.) and with stirring for 4 h.

Next a solution containing 0.152 g of the aforementioned hybrid silica-polyester material HR1 dissolved in a mixture of 0.038 g of distilled water and of 0.673 g of absolute ethanol was added to the reaction medium.

The thereby obtained medium was left with stirring at room temperature (25° C.) for 1 h, and then kept at room temperature for 20 h.

The deposition of this composition on the silicon cell covered with SiN was achieved according to the dipping-withdrawal technique (dip-coating). To do this, the silicon cell covered with SiN was cleaned beforehand with ethanol and protected at its electric tracks with a peelable adhesive (F/LB adhesive, ATP Adhesive Systems).

The deposition of the anti-reflective layer was carried out by totally immersing the cell in the composition, and then by gradually withdrawing it out of the composition at a linear rate of 2 mm/s, whereby a continuous, homogeneous and transparent coating was obtained on the surface of the SiN layer deposited earlier.

The cell provided with the thereby made deposit was then placed in an oven for 2 h at 120° C.

Thus, deposition of a coating layer having a thickness of the order of 350 nm was obtained on the surface of the cell.
Synthesis of the Photovoltaic Module The 4 substantially identical, photovoltaic cells, made under the conditions described above were used for synthesizing a photovoltaic module.

To do this, after withdrawal of the peelable adhesive covering the electric contacts, the cells were deposited side by side (as a daisy chain) on an aluminum sheet and electrically connected with each other. An EVA sheet (a sheet with a thickness equal to 0.5 mm, marketed by Whenzhou Longwan Plastic Additives Co., Ltd.) was deposited on the thereby formed system and a glass plate was then deposited on the assembly.

The multilayer structure of the thereby formed assembly was laminated inside a laminator comprising a cavity separated by a deformable membrane in two portions, i.e. (i) a low portion including as a base plane a heating resistor; and (ii) an upper chamber. To do this, the assembly formed by the four cells deposited on the aluminum sheet and covered with the EVA sheet and the glass sheet was introduced into the lower chamber, on the heating resistor brought to a temperature of 100° C. and at atmospheric pressure, with a negative pressure (0.1 mm Hg) generated in the upper chamber upon introducing the assembly. Next, the lower chamber was depressurized (0.1 mm Hg) for 5 minutes, the deformable membrane being flattened onto the glass sheet and consequently crushing the polymer sheet brought to 100° C. After setting the lower chamber of the laminator back to atmospheric pressure, the made module was withdrawn from the laminator and brought to 156° C. in an oven for 15 minutes so as to achieve its crosslinking.

For comparison purposes, a control module was made under exactly the same conditions as the module described above, but with the single difference that no anti-reflective layer according to the invention based on the hybrid material HR1 was deposited.

The module according to the invention has clearly improved properties as compared with the control module.

EXAMPLE 2: APPLYING THE ANTI-REFLECTIVE COATING BEFORE METALLIZATION OF THE SURFACE OF PHOTOVOLTAIC CELLS

The photovoltaic cells are prepared in the same way as according to the description of Example 1. A single crystal silicon slice (wafer) with dimensions equal to 125 mm×125 mm and with a thickness equal to 200 microns was cut out in a single crystal, immersed in a potash bath at 80° C. (for suppressing the surface defects), and then rinsed in a bath of distilled water. Doping of the silicon by diffusing phosphorus was then achieved by placing the wafer in an oven brought to 850° C. in the presence of $POCl_3$ and oxygen. Following this treatment, the wafer was immersed in a bath of hydrofluoric acid.

An SiN layer was then deposited on the thereby prepared wafer, according to a direct PECVD method at a frequency of 40 kHz, at 450° C., in the presence of $NH_3$ and $SiH_4$, whereby an SiN layer with a thickness of 80 nm and having a refractive index of 2.05 was formed.

An anti-reflective layer according to the invention was then deposited on the SiN layer according to a sol-gel method applying the procedure hereafter.

In a flask at room temperature, 70 g of ethanol were mixed with 10 g of a colloidal solution of silicon oxide $SiO_2$. This solution is an aqueous dispersion with 40% by weight of $SiO_2$ particles of size 20 nm, marketed by Alfa Aesar. A mixture of 72.857 g of ethanol and of 17.143 g of sol-gel varnish as described in Example 1 was then added. This mixture was stirred for 3 h, at room temperature (25° C.). 90 g of butanol were then added to the reaction medium, and the whole stirred for 1 h.

The deposition of this composition on the silicon cell covered with SiN was achieved according to the dipping-withdrawal technique (dip-coating). To do this, the silicon cell covered with SiN is cleaned beforehand with ethanol and protected at its rear face with a peelable adhesive (F/LB adhesive, ATP Adhesive Systems). The deposition of the anti-reflective layer was carried out by totally immersing the cell into the composition, and then by gradually withdrawing it out of the composition at a linear rate of 2 mm/s, whereby a continuous, homogeneous and transparent coating was obtained on the surface of the SiN layer deposited earlier.

The cell provided with the thereby achieved deposit was then placed in an oven for 1 h at 120° C.

Thus, the deposition of a coating layer with a thickness of the order of 150 nm was obtained on the surface of the cell.

Surface metallization was then carried out by forming by screen printing metal tracks on the SiN layer (front contacts) and on the face of the silicon not covered with SiN (rear contacts). These metal tracks were formed by depositing silver paste, and then by raising the temperature of the latter to 850° C.

The synthesis of the photovoltaic module is finalized as described in Example 1, and the module according to the invention has improved electric properties as compared with the control module.

EXAMPLE 3: THE ANTI-REFLECTIVE LAYER OF THE INVENTION MAY ALSO BE DEPOSITED ON THE GLASS SHEET DEPOSITED AT THE SURFACE OF THE PHOTOVOLTAIC MODULES

A mixture of the sol-gel varnish mentioned in Example 2 and of ethanol solvent (to the 10 g of the varnish described in Example 2 were added 16 g of ethanol) is deposited by dip coating at a rate of 1.4 mm/s. The anti-reflective layer from the present invention is then dried for 2 h at 120° C.

The thereby varnished glass sheet is then deposited on a photovoltaic module made according to the description of Example 1. This module has clearly improved properties as compared with the control module.

EXAMPLE 4: ANTI-REFLECTIVE LAYER ON A FLEXIBLE PHOTOVOLTAIC MODULE

The anti-reflective layer of the present invention was used on a flexible solar module. On a flexible PET (polyethylene terephthalate) film, a hard varnish of the polysiloxane type is deposited by dip coating at 2.5 mm/s, one of the faces of the film being protected. This hard varnish is provided by Gaematech, under the Mexmer range. This hard varnish is dried for 1 h at 120° C. in an oven with forced convection.

The anti-reflective layer of the present invention, described in Example 3 (sol-gel varnish of Example 1 diluted in ethanol), is then deposited by dip-coating at a rate of 1.8 mm/s and dried for 1 h at 120° C.

This varnished PET film is then deposited on a conventional flexible solar module, the face varnished by the anti-reflective assembly being placed against the module. The contact between the module and the treated PET film is achieved with a fine layer of isopropanol, which upon drying allows contact between the treated PET and the photovoltaic module. For comparison purposes, a control module is made under the same conditions as the module described above, with the only difference that the PET film was not varnished with the anti-reflective layer (sol-gel).

The flexible module according to the invention has improved electric properties as compared with the control module.

EXAMPLE 5: ANTI-REFLECTIVE LAYER ON THE LENS OF A SOLAR CONCENTRATION SYSTEM (CPV)

The assembling of photovoltaic concentration systems (CPV) was performed. These systems consist of two portions:
  The first is a plane-convex lens in soda-calcium glass which ensures a concentration factor of 500×
  The second portion consists of a triple junction assembly provided by Spectrolab, placed in the focal plane of the lens.

A lens was thus treated for anti-reflection by applying the sol-gel varnish described in Example 2. The lens was treated on both of its faces by dip-coating according to the following sequence.

1) Cleaning:
   Dipping in an acid and detergent bath equipped with alpha sound generators.
   Rinsing in 2 successive baths of tap water, and then of demineralized water.
   Drying for 3 minutes in a bath with pulsed hot air.
2) Varnishing by Dip-Coating:
   The lens is dipped into a bath containing the sol-gel varnish described in Example 2 and maintained at a bath temperature of 20° C. and then withdrawn at a constant rate of 2 mm/s. After 5 minutes at room temperature, it is baked at 120° C. for 1 hour.

A control CPV module was then made from an untreated lens and a test CPV module from a treated lens.

Both of these modules were then placed outdoors in sunny weather and illuminated under conditions of direct sunlight. The electrical and optical performances of both modules were measured. The results are recorded in the table hereafter:

|  | Measurements | |
| --- | --- | --- |
|  | Light power (in %) | Electric power (in %) |
| Untreated lens | 80.45 | 79.73 |
| Treated lens | 84.37 | 83.80 |

The invention claimed is:

1. A photovoltaic device comprising:
   a semiconducting material having a photovoltaic effect when the semiconducting material is subject to electromagnetic radiation; and
   one or two single-layer deposit anti-reflective layers, wherein each of the one or two single-layer deposit anti-reflective layers is transparent towards said electromagnetic radiation and comprises a sol/gel coating and dispersed objects with dimensions of less than 400 nm in the sol/gel coating, wherein the sol/gel coating comprises silica, and wherein each of the dispersed objects:
   is transparent towards said electromagnetic radiation;
   comprises:
      an inorganic core substrate having dimensions and a refractive index, $n_C$; and
      a crust surrounding the inorganic core substrate, wherein the crust has a refractive index, $n_E$, distinct from $n_C$, and wherein the difference between $n_C$ and $n_E$ is an absolute value of at least 0.1; and
   has a core dimensions to dispersed object dimensions ratio that is between 1:1.8 and 1:4.

2. The photovoltaic device according to claim 1, further comprising a protective layer of said semiconducting material, wherein one of the one or two single-layer deposit anti-reflective layers is an anti-reflective internal layer that is between the semiconducting material and the protective layer.

3. The photovoltaic device according to claim 1, further comprising a solar concentration system equipped with a lens having two faces, wherein one of the one or two single-layer deposit anti-reflective layers is a first anti-reflective Ions layer that is on one of the two faces of the lens, in either direct or indirect contact with one of the two faces of the lens.

4. The photovoltaic device according to claim 2, wherein the protective layer is a glass sheet or a polymeric sheet.

5. The photovoltaic device according to claim 2, wherein the protective layer is deposited on a polymeric sublayer, and wherein the anti-reflective internal layer is between the semiconducting material and the polymeric sublayer.

6. The photovoltaic device according to claim 1, wherein each of the one or two single-layer deposit anti-reflective layers has a thickness between 10 nm and 1 micron.

7. The photovoltaic device according to claim 1, wherein each of the one or two single-layer deposit anti-reflective layers has a thickness between 50 nm and 500 nm.

8. The photovoltaic device according to claim 2, wherein the protective layer is further provided with one of the one or two single-layer deposit anti-reflective layers deposited on the protective layer.

9. The photovoltaic device according to claim 1, wherein the device is a photovoltaic module.

10. The photovoltaic device according to claim 4, wherein the polymeric sheet is polyethylene terephthalate (PET) or ethylene tetrafluoroethylene (ETFE).

11. The photovoltaic device according to claim 5, wherein the polymeric sublayer is an ethylene-vinyl acetate (EVA) matrix.

12. The photovoltaic device according to claim 1, wherein the core substrate is selected from the group consisting of a mineral oxide, metal sulfide, metal nitride, metal halide, metal, and combinations thereof.

13. The photovoltaic device according to claim 1, wherein the core substrate is selected from the group consisting of silica, metal oxides, metal sulfides, metals, and combinations thereof.

14. The photovoltaic device according to claim 3, wherein one of the one or two single-layer deposit anti-reflective layers is a second anti-reflective layer that is on the other of the two faces of the lens, in either direct or indirect contact with the other of the two faces of the lens.

15. The photovoltaic device according to claim 1, wherein the core dimensions to dispersed object dimensions ratio is 1:2.5.

16. The photovoltaic device according to claim 1, wherein the difference between $n_C$ and $n_E$ is an absolute value of at least 0.3.

17. The photovoltaic device according to claim 2, wherein there is only one of the one or two single-layer deposit anti-reflective layers and the one single-layer deposit anti-reflective layer is the anti-reflective internal layer.

18. The photovoltaic device according to claim 1, wherein the sol/gel coating is synthesized from a tetraalkoxysilane.

19. The photovoltaic device according to claim 1, wherein the sol/gel coating is synthesized from a mixture of alkoxides that comprises:
   at least one silane having 4 hydrolyzable groups; and
   at least one silane having less than 4 hydrolyzable groups having a formula of $R_nSiX_{4-n}$, wherein:
      n is an integer equal to 1, 2 or 3;
      each R group is independently selected and is a non-hydrolyzable organic group; and
      X is (i) a hydrolyzable group selected from the group consisting of trimethoxysilane, triethoxysilane, γ-propyltrimethoxysilane, γ-propyltriethoxysilane, γ-aminopropyl-trimethoxysilane, γ-aminopropyl-triethoxysilane, γ-mercaptopropyl-trimethoxysilane, γ-mercaptopropyl-triethoxysilane, γ-(meth-)acryloylpropryl-trimethoxysilane, γ-(meth)acryloylpropyl-triethoxysilane, γ-glycidoxypropyl-trimethoxysilane, γ-glycidoxypropyl-triethoxysilane, di-methoxysilane, di-ethoxysilane, polydimethylsiloxane α-ω-disilanol, and polydiethylsiloxane α-ω-disilanol, or (ii) a halogen group.

20. A method for forming a single-layer deposit anti-reflective layer on a semiconducting material of a photovoltaic device, the method comprising:

depositing a single layer of material transparent towards electromagnetic radiation on the semiconducting material of the photovoltaic device, wherein said material contains a sol/gel and dispersed objects with dimensions of less than 400 nm in the sol/gel, wherein the sol/gel comprises silane, and wherein each of the dispersed objects:

is transparent towards said electromagnetic radiation;

comprises:

an inorganic core substrate having dimensions and a refractive index, $n_C$; and a crust surrounding the inorganic core substrate, wherein the crust has a refractive index, $n_E$, distinct from $n_C$, and wherein the difference between $n_C$ and $n_E$ is an absolute value of at least 0.1; and has a core dimensions to dispersed object dimensions ratio that is between 1:1.8 and 1:4;

thereby forming the single-layer deposit anti-reflective layer on the semiconductor material of the photovoltaic device, wherein the single-layer deposit anti-reflective layer is transparent towards the electromagnetic radiation and comprises the dispersed objects in a sol/gel coating that comprises silica, wherein the sol/gel coating results from the sol/gel.

21. The method according to claim 20, wherein the core substrate is selected from the group consisting of a mineral oxide, metal sulfide, metal nitride, metal halide, metal, and combinations thereof.

22. The method according to claim 20, wherein the core substrate is selected from the group consisting of silica, metal oxides, metal sulfides, metals, and combinations thereof.

23. The method according to claim 20, wherein the core dimensions to dispersed object dimensions ratio is 1:2.5.

24. The method according to claim 20, wherein the difference between $n_C$ and $n_E$ is an absolute value of at least 0.3.

25. The photovoltaic device according to claim 17, wherein the tetraalkoxysilane is tetramethoxysilane or tetraethoxysilane.

* * * * *